(12) United States Patent
Chen et al.

(10) Patent No.: US 6,211,097 B1
(45) Date of Patent: Apr. 3, 2001

(54) PLANARIZATION PROCESS

(75) Inventors: Shuenn-Jeng Chen, Chia-Li; Ching-Hsing Hsieh, Pingtung Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/223,398

(22) Filed: Dec. 30, 1998

(30) Foreign Application Priority Data

Sep. 2, 1998 (TW) ................................. 87114535

(51) Int. Cl.$^7$ ........................... H01L 21/31; H01L 21/469
(52) U.S. Cl. .......................... 438/787; 438/759; 438/763; 438/788
(58) Field of Search .................................. 438/759, 763, 438/787, 788

(56) References Cited

U.S. PATENT DOCUMENTS 5,948,700 * 9/1999 Zheng .................................. 438/694

* cited by examiner

*Primary Examiner*—Charles Bowers
*Assistant Examiner*—Nema Berezny
(74) *Attorney, Agent, or Firm*—Jiawei Huang; J. C. Patents

(57) ABSTRACT

This invention provides a planarization method that solves the microscratch problem caused by chemical-mechanical polishing. This method comprises the following steps: providing a substrate with semiconductor devices, forming a SRO oxide on the substrate, forming a SOG layer on the SRO layer, performing a curing process, performing an implantation process during the curing process, forming an oxide layer on the SRO oxide, and planarizing the oxide layer by CMP. Another SOG layer is formed on the planarized oxide layer, a curing process is performed on the second SOG layer, and a cap oxide layer is formed on the second SOG layer to adjust the thickness of the dielectric layer. This invention can solve conventional problems such as microscratching and metal bridges.

6 Claims, 2 Drawing Sheets

PLANARIZATION PROCESS

CROSS-REFERENCE TO RELATED APPLICATION

This application claims the priority benefit of Taiwan application serial no. 87114535, filed Sep. 2, 1998, the full disclosure of which is incorporated herein by reference.

BACKGROUND OF THE INVENTION

1. Field of Invention

The present invention relates to a planarization process. More particularly, the present invention relates to a planarization process that solves the problem of microscratches caused by chemical-mechanical polishing.

2. Description of Related Art

With the steady improvement in integrated circuit (IC) fabrication, the multi-conductive layer has become a standard structure in semiconductor technologies. The material and position of the dielectric layers are increasingly important. Because of the requirement for high resolution for photolithography, the planarization of dielectric layer has been emphasized. The traditional methods of planarization for semiconductor technologies are spin-on glass (SOG) and chemical-mechanical polishing (CMP). SOG is for local planarization, and CMP is for global planarization. Of the two processes, CMP is used more frequently.

FIGS. 1A–1C are schematic, cross-sectional views of a conventional planarization process for manufacturing a dielectric layer.

In FIG. 1A, semiconductor devices (not shown) are formed on a substrate 10. The substrate is, for example, a silicon substrate 10. Conducting wires 12 are formed on the substrate 10. An oxide layer 14 is formed on the substrate 10. The oxide layer 14 can be silicon-rich oxide (SRO) formed by plasma enhanced chemical vapor deposition (PECVD).

A SOG layer 16 is formed on the oxide layer 14. Because the SOG is a dielectric material dissolved in a chemical solvent, the SOG layer 16 can be formed by a spin-coating method in which planarization is performed by spreading chemical solvent with SOG material on the surface of the substrate 10. A thermal process, also known as a curing process, is performed to evaporate the chemical solvent and the SOG layer 16 is thus formed on the oxide layer 14. However, a small portion of the chemical solvent may be left in the SOG layer 16 after the curing process. The SOG layer 16 is exposed by a contact hole and then undergoes an $O_2$-plasma bombarding process and an amine-solvent embedding process. Electrophilic groups are therefore formed in SOG layer 16 and water molecules are subsequently absorbed. Next, a metallization process is performed at a very high temperature which allows the absorbed water molecules to evaporate and leave the SOG layer 16. It is also highly possible that the water molecules are trapped in metal to produce voids, which poison the metal. Therefore, an ion-implantation process, with ions such as arsenic ions, is performed during the curing process. The bonds between solvent molecules and the dielectric material can be broken by ions with sufficient dynamic energy. The ions take the place of the solvent molecules and the solvent molecules are thus removed from the dielectric material. This means that the top portion of the SOG layer 16 is transformed to an ion-doped SOG layer 18 and that the electrophilic ability is largely reduced in order to prevent out-gassing problem from occurring in the metallization process.

An oxide layer 20 is formed on the planarized SOG layer 16. The oxide layer 20 can be formed by plasma enhanced chemical vapor deposition (PECVD), for example. An inter-metal dielectric with a sandwich structure is formed by the three oxide layers 14, 16, 20.

Referring to FIG. 1B, the oxide layer 20 is polished by a chemical-mechanical polishing process to obtain a globally planarized dielectric layer. Because of the existence of microparticles, the chemical-mechanical polishing process will cause microscratch 22 on the surface of the oxide layer 20. The metal is deposited into the microscratch 22 and a metal bridge 24 is thus formed during the following metallization process. Existence of the metal bridge 24 over the microscratch 22 may lead to a connection between two independent conducting wires.

Referring to FIG. 1C, conventional method for avoiding metal bridges is to form a cap oxide layer 26 on the polished oxide layer 20. But voids can also be produced during the process of cap oxide layer 26 filling the microscratch.

SUMMARY OF THE INVENTION

Accordingly, the present invention provides a planarization method that solves the problem of metal bridges caused by the microscratches.

To achieve these and other advantages and in accordance with the purpose of the invention, as embodied and broadly described herein, the invention provides a planarization method. A SOG layer is formed on the scratched oxide layer to obtain a planarized surface which prevents the occurrence of a metal bridge. Furthermore, a curing method for SOG layer is also proposed. The curing method uses an electron beam with a high penetration ability to obtain a defects-free oxide layer which resembles a thermally treated oxide layer. The phenomenon of a metal-poisoned contact plug is thus reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
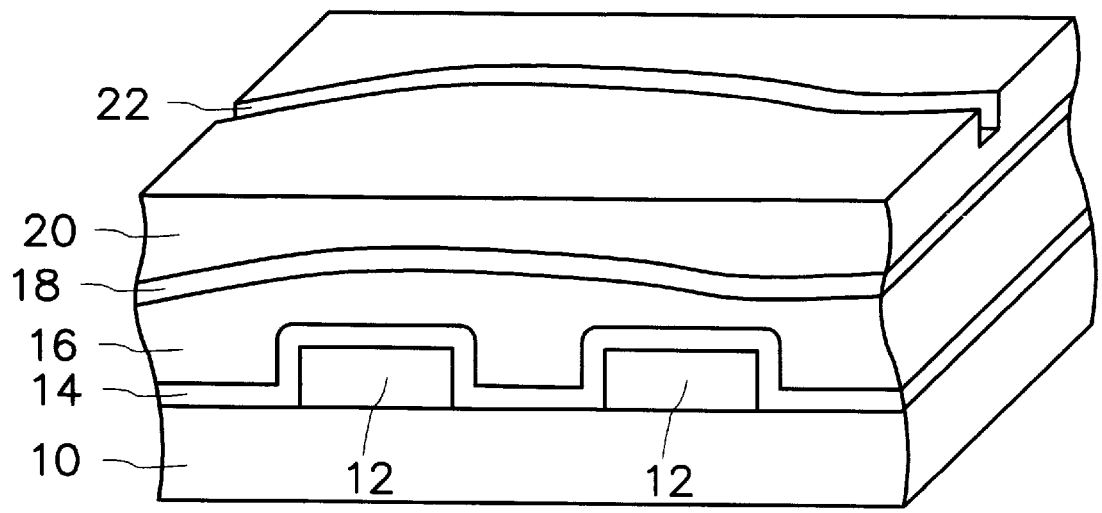
FIGS. 1A–1C are schematic, cross-sectional views of a conventional planarization process for manufacturing a dielectric layer.
Figure 1B:
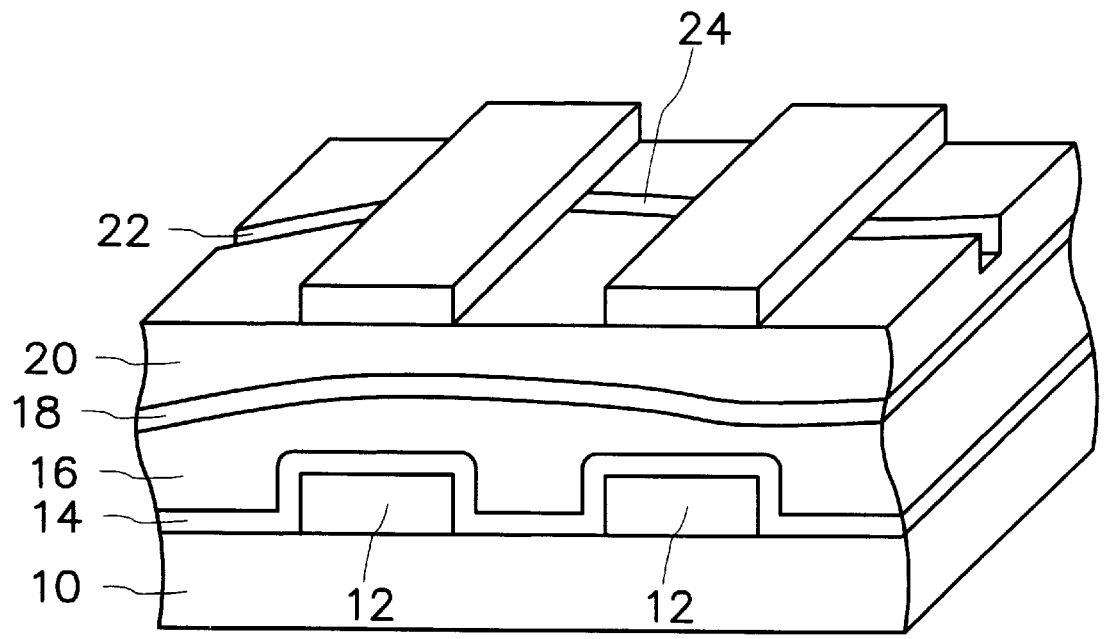
Figure 1C:
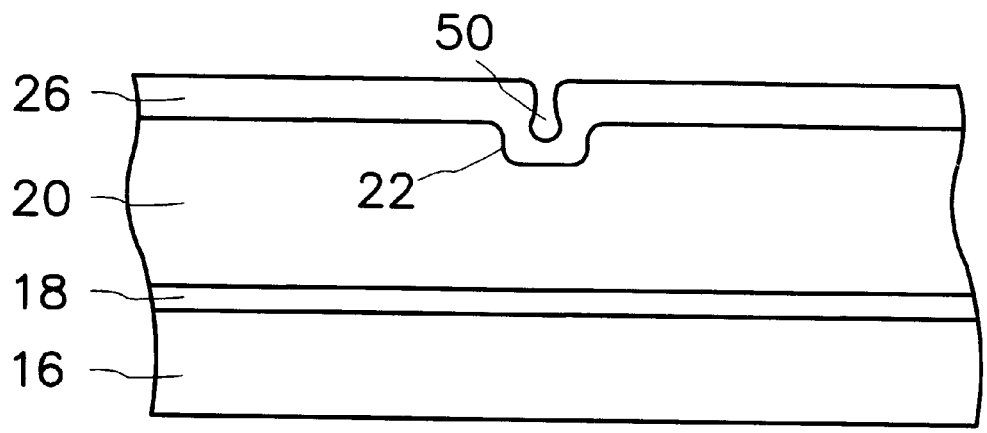

Reference will now be made in detail to the present preferred embodiments of the invention, examples of which are illustrated in the accompanying drawings. Wherever possible, the same reference numbers are used in the drawings and the description to refer to the same or like parts.

Figure 2:
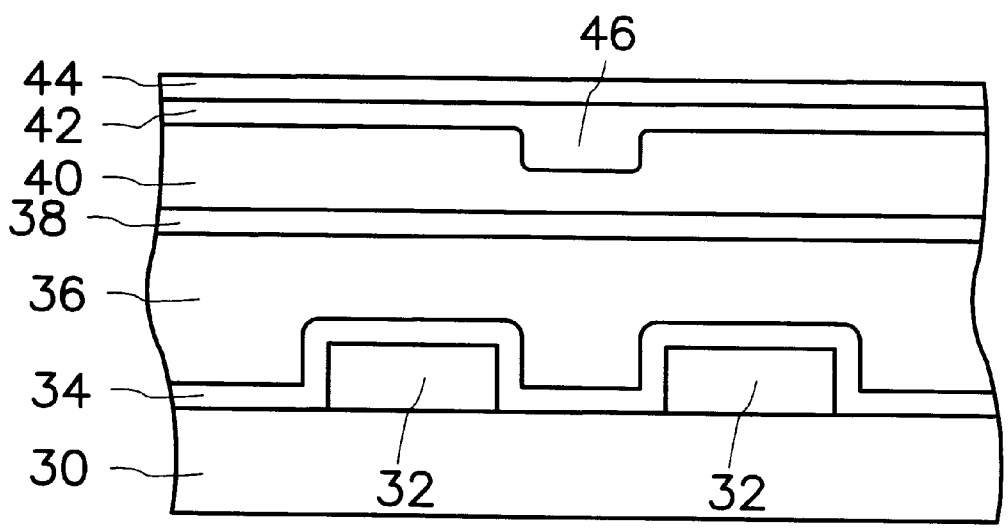
FIG. 2 is schematic, cross-sectional of a dielectric layer planarized according to the preferred embodiment of this invention.

Referring to FIG. 2, a semiconductor substrate 30 with semiconductor devices (not shown) is provided. The semiconductor substrate 30 is, for example, a silicon substrate. A conducting layer 32 (includes gates and conducting wires) is formed on the substrate 30. An oxide layer is formed on the substrate 30. The oxide layer can be a silicon-rich oxide (SRO) layer 34 formed by plasma enhanced chemical vapor deposition.

A SOG layer 36 is formed on the SRO layer 34. The process of forming SOG layer 36 includes spin-coating and curing steps. Because the SOG layer 36 is a dielectric material dissolved in chemical solvent, the SOG layer 36 is spin-coated on the surface of the oxide layer 34. The liquid phase SOG layer 36 flows on the surface of the SRO layer 34 to obtain local planarization. A curing process similar to a thermal treatment is performed to evaporate the chemical solvent in the SOG layer 36 and an ion implantation step follows to implant ions such as arsenic ions into the SOG layer 36. An ion-doped SOG layer 38 is thus formed on the surface of the SOG layer 36. Metal poisoning, which could be caused by the subsequent processes, is prevented by this curing step.

An oxide layer 40 is formed on the planarized ion-doped SOG layer 38. The oxide layer 40 can be formed by plasma enhanced chemical vapor deposition. An inter-metal dielectric with a sandwich structure is thus formed by the three oxide layers 34, 36, 40.

A chemical-mechanical polishing process is performed on the oxide layer 40 to obtain a globally planarized dielectric layer. Because of the existence of microparticles, the chemical-mechanical polishing process causes microscratch 46 on the surface of the oxide layer and the planarized surface of the oxide layer 40 will be destroyed. Therefore, metal bridges could be produced in the following processes.

A preferable SOG layer 42 such as Fox-14 is formed on the oxide layer 40 and fills the microscratch 46. Fox-14 is a material with a high planarization ability and the difference in its thickness before and after the curing process is small.

In order to prevent metal from being poisoned during following processes, an electron beam with high penetrating ability is performed during the curing process. The electron beam provides energy for evaporating solvent molecules and recrystallizing molecules of the SOG layer 42. Therefore, the SOG layer 42 resembles a thermally treated thermal oxide that is free of defects, and it will not be influenced by a follow-up cleaning step after the subsequent etching process. A cap oxide layer 44 is formed on the SOG layer 42 to control the thickness of the dielectric layer.

A dielectric layer with new structure is obtained according to this invention. Referring to FIG. 2, the structure of this dielectric layer includes: a first oxide layer 34 on conducting wires 32, a first SOG layer 36 on the first oxide layer 34, a second oxide layer 40 on the first SOG layer 36, wherein the second oxide layer 40 is planarized by chemical-mechanical polishing, a second SOG layer 42 on the second oxide layer 40, and a cap oxide layer 44 on the second SOG layer 42 to control the thickness of the dielectric layer. The surface of the first SOG layer 36 is doped with arsenic ions to form an ion-doped SOG layer 38.

In summary, the features of the invention include:

1. A SOG layer is formed on the scratched oxide layer. Therefore, the microscratch is repaired and the surface is planarized.
2. If the unfilled microscratch were present, metal would be deposited into the microscratch and a metal bridge would thus be formed during the following metallization process. Two independent conducting wires could be connected to each other by the metal bridge over the microscratch. By filling the microscratch, this invention precludes the metal bridge.
3. A curing process similar to a thermal treatment is performed to evaporate the chemical solvent in the SOG layer and an ion implantation step follows to implant ions into the SOG layer. The subsequent processes, which would cause metal poisoning, are avoided by this curing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A planarization process, comprising the steps of:
   providing a substrate with semiconductor devices;
   forming a first oxide layer on the substrate;
   applying a first SOG layer on the first oxide layer;
   curing the first SOG layer;
   forming a second oxide layer on the first SOG layer;
   performing a chemical-mechanical polishing process on the second oxide layer;
   applying a second SOG layer on the second oxide layer;
   curing the second SOG layer; and
   forming a cap oxide layer on the second SOG layer.
2. The method of claim 1, wherein the first oxide layer includes a silicon-rich oxide layer, and the step of forming the first oxide layer includes plasma enhanced chemical vapor deposition.
3. The method of claim 1, wherein the second oxide layer includes silicon oxide, and the step of forming the second oxide layer includes plasma enhanced chemical vapor deposition.
4. The method of claim 1, wherein the step of curing the first SOG layer includes a thermal process and an ion implantation process.
5. The method of claim 4, wherein the ion implantation process includes implanting arsenic ions.
6. The method of claim 1, wherein the step of curing the second SOG layer includes using an electron beam.

* * * * *